United States Patent
Oh et al.

(10) Patent No.: US 7,428,026 B2
(45) Date of Patent: Sep. 23, 2008

(54) POLYCRYSTALLINE LIQUID CRYSTAL DISPLAY DEVICE COMPRISING A DATA LINE DISPOSED BETWEEN TWO SEPARATED PORTIONS OF THE GATE LINE

(75) Inventors: Jae-Young Oh, Gyeonggi-Do (KR); Seong-Hee Nam, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/489,552

(22) Filed: Jul. 20, 2006

(65) Prior Publication Data

US 2006/0256251 A1 Nov. 16, 2006

Related U.S. Application Data

(62) Division of application No. 10/848,057, filed on May 19, 2004, now Pat. No. 7,098,971.

(30) Foreign Application Priority Data

Jun. 30, 2003 (KR) .............................. 2003-43990

(51) Int. Cl.
*G02F 1/136* (2006.01)
*H01L 29/04* (2006.01)

(52) U.S. Cl. .............................. 349/47; 349/43; 349/46; 257/59

(58) Field of Classification Search ............. 349/46–47, 349/42
See application file for complete search history.

(56) References Cited

U.S. PATENT DOCUMENTS

| 5,191,453 | A | * | 3/1993 | Okumura ...................... 349/47 |
| 5,744,820 | A | * | 4/1998 | Matsushima et al. .......... 257/59 |
| 5,793,460 | A | * | 8/1998 | Yang ........................... 349/148 |
| 5,966,190 | A | * | 10/1999 | Dohjo et al. ................... 349/39 |
| 2003/0058376 | A1 | | 3/2003 | Zhang |

* cited by examiner

*Primary Examiner*—David C Nelms
*Assistant Examiner*—W. Patty Chen
(74) *Attorney, Agent, or Firm*—McKenna Long & Aldridge LLP

(57) ABSTRACT

A method of fabricating a polysilicon LCD device includes forming an active layer on a substrate, forming a first insulating layer having a first thickness and a second insulating layer having a second thickness sequentially on the active layer, forming a photoresist on the second insulating layer, ashing the photoresist, etching first portions of the first thickness of the first insulating layer corresponding to the source and drain electrode regions and the reduced second thickness of the second insulating layer within the first regions to expose source and drain regions of the active layer corresponding to the source and drain electrode regions, and etching a second portion of the second thickness of the second insulating layer to expose a portion of the first insulating layer corresponding to a gate electrode region, forming a gate electrode, a source electrode, and a drain electrode simultaneously on the second insulating layer, forming a passivation layer on the gate electrode, the source electrode, and the drain electrode, and forming a pixel electrode on the passivation layer.

3 Claims, 8 Drawing Sheets

US 7,428,026 B2

POLYCRYSTALLINE LIQUID CRYSTAL DISPLAY DEVICE COMPRISING A DATA LINE DISPOSED BETWEEN TWO SEPARATED PORTIONS OF THE GATE LINE

This application is a Divisional of prior application Ser. No. 10/848,057, filed May 19, 2004 now U.S. Pat. No. 7,098,971, which claims the benefit of Korean Patent Application No. 43990/2003 filed in Korea on Jun. 30, 2003, each of which are hereby incorporated by reference in their entirety as if fully set forth herein.

BACKGROUND OF THE INVENTION

1. Field of the Invention

The present invention relates to a driving circuit for a liquid crystal display (LCD) device and a method of fabricating a driving circuit for an LCD device, and more particularly, to a polycrystalline LCD device.

2. Description of the Related Art

In general, a driving circuit device can be an individual type comprising a display unit for displaying images and a driving circuit unit for driving the display unit, wherein the display unit and the driving circuit unit are connected to each other by a tape carrier package (TCP), for example. Alternatively, the driving circuit device can be an integrated type comprising a display unit and a driving circuit unit formed on the same substrate. Accordingly, the integrated type driving circuit device can be more easily fabricated than the individual type driving circuit device. In the integral type driving circuit device, polysilicon is commonly used as a channel layer since polysilicon has better electric mobility an amorphous silicon. Thus, an LCD using the polysilicon integral type driving circuit device can operate at high speeds. For example, electric mobility of an amorphous thin film transistor (TFT) is 0.1~1 $cm^2/Vsec$, an electric mobility of a polysilicon TFT fabricated using an excimer laser exceeds 100 $cm^2/Vsec$.

FIG. 1 is a schematic plan view of a polysilicon LCD device according to the related art. In FIG. 1, an integral type driving circuit device includes a display unit 101 having unit pixels arranged in a matrix configuration, and a driving circuit unit 102 arranged along an outer periphery of the display unit 101 for driving devices of the display unit. The driving circuit unit 102 is provided with a gate driver 104 and a data driver 103, and the display unit 101 and the driving circuit unit 102 are formed on the same substrate. In the driving circuit unit 102, a complementary metal oxide semiconductor (CMOS) device includes an PMOS TFT and an NMOS TFT that are connected to the unit pixels of the display unit.

FIGS. 2A to 2I are cross sectional views of a fabrication process for a polysilicon LCD device according to the related art. In FIG. 2A, a substrate 201 is prepared, and a buffer layer 202 formed of a silicon oxidation layer ($SiO_2$) is formed on the substrate 201. Then, an amorphous silicon layer 203 is deposited onto the silicon oxidation layer ($SiO_2$) by a plasma enhanced chemical vapor deposition (PECVD) process at a low temperature. Next, a heat treatment is performed at approximately 400° C. during a dehydrogenation process for removing hydrogen included in the amorphous silicon layer. The dehydrogenation is performed in order to prevent hydrogen included in the amorphous silicon layer from corrupting a crystallization process of the amorphous silicon layer and thereby prevent the substrate from being damaged.

In order to crystallize the amorphous silicon layer, glass is used as a substrate and the substrate is heated. However, during fabrication of the LCD device by the heat treatment, the glass used as the substrate may be deformed by the heat. Therefore, during fabrication of a polysilicon TFT on a glass substrate, a laser annealing method is used to convert the amorphous silicon into polycrystalline silicon by an instantaneous heat treatment at a low temperature. For example, an excimer laser beam is irradiated onto the substrate where the amorphous silicon is formed, thereby converting the amorphous silicon layer into a crystalline silicon layer by annealing. Next, the polysilicon is dry-etched to define an active layer.

In FIG. 2B, a TFT active layer 203a is formed within a display unit region, and an N-type TFT active layer 203b and a P-type TFT active layer 203c are formed within a driving circuit unit region.

In FIG. 2C, a gate insulating layer 204 formed of $SiO_2$ or SiNx and the active layers 203a, 203b, and 203c are formed on the entire surface of the substrate 201. The gate insulating layer 204 protects the active layers 203a, 203b, and 203c and insulates a subsequently-formed upper layer. Then, a gate metal layer is formed on the gate insulating layer 204 by a sputtering method. Next, the gate metal layer is patterned by photolithographic processes to form a gate electrode 205. The gate electrode may be composed of a double layer of Al and Mo in order to provide excellent conductivity and excellent ohmic contact characteristics with an indium tin oxide (ITO) material used as a pixel electrode. Alternatively, the gate electrode may be composed of a single layer of only Mo.

Since the N-type TFT makes use of electrons as carriers, it may generate a leakage current due to the electrons. Accordingly, the N-type TFT is fabricated as a lightly doped drain (LDD) type that effectively prevents the leakage current. Thus, the LDD-type TFT is formed by injecting impurity ions into a polysilicon source/drain region, wherein the impurity ions may include an element, such as Phosphorus or Arsenic, corresponding to the fifth group of the periodic table.

In FIG. 2D, a photo resist pattern 206 is formed to shield the P-type TFT region by a photomasking process that includes exposing and developing processes. Then, N-type ions of a low concentration are injected into the active region of the N-type TFT pixel unit and circuit unit regions. During the phosphorus ion injection, the gate electrode 205 is positioned to function as a blocking mask so that the N-type ions are injected into the source/drain regions. After injecting the N-type ions, the photoresist pattern 206 is removed.

In FIG. 2E, a photoresist pattern 207 is formed to shield the gate electrode 205 and portions of the source/drain region of the N-type TFT pixel unit and circuit unit regions, and the entire P-type TFT circuit unit region. By applying the photoresist 207 as a blocking mask of the injected ions, N-type impurity ions of a high concentration are injected into the source/drain regions of the N-type TFT pixel unit and circuit unit regions, thereby forming LDD-type TFTs. For example, the LDD-type TFTs both include LDD regions 208 having a low impurity concentration and source and drain regions 209 having a high impurity concentration.

In FIG. 2F, a photoresist 210 is formed to cover the completed N-type TFT pixel unit and circuit unit regions. Then, P-type impurity ions are injected into the portions 211 of the active layer of the P-type TFT circuit unit region. Since holes are used as charge carriers, leakage current due to hot carriers is not easily generated in the P-type TFT. Accordingly, the P-type TFT may not include LDD regions. Then, the photoresist 210 is removed.

In FIG. 2G, an insulating layer 214 comprising $SiO_2$ or SiNx is formed on the gate electrode 205, and a contact hole 220 is formed in the insulating layer 214 corresponding to the source/drain regions in the N-type and P-type TFTs.

In FIG. 2H, a conductive layer for a source/drain electrode is formed in the contact hole 220 and patterned, thereby forming source/drain electrodes 215 and 216.

In FIG. 2I, a passivation layer 217 of an organic layer or an inorganic layer is formed on the source/drain electrodes 215 and 216. Then, the passivation layer 217 on the drain electrode of the TFT is removed to form a contact hole 219. Next, a pixel electrode 218 is formed on the passivation layer 217 and connected to the drain electrode 216 through the contact hole 219, thereby completing the LCD device.

Formation of the polysilicon TFTs is a very complicated process although the polysilicon TFTS have excellent operation characteristics. In addition, a plurality of masks are required to fabricate the polysilicon TFT LCD device. For example, since each mask process accompanies a photolithography process, the fabrication process is delayed and results in possible environmental contamination.

SUMMARY OF THE INVENTION

Accordingly, the present invention is directed to a polycrystalline liquid crystal display device and method of fabricating a polysilicon liquid crystal display device that substantially obviates one or more of the problems due to limitations and disadvantages of the related art.

An object of the present invention is to provide a polysilicon LCD device having a reduced number of fabrication processes.

Another object of the present invention is to provide a method of fabricating a polysilicon LCD device having a reduced number of fabrication processes.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of fabricating a polysilicon LCD device includes forming an active layer on a substrate, forming a first insulating layer having a first thickness and a second insulating layer having a second thickness sequentially on the active layer, forming a photoresist on the second insulating layer, the photoresist having first portions exposing first regions of the second insulating layer each corresponding to one of a source electrode region and a drain electrode region, and a second portion overlying a channel region of the active layer, the second portion having first thickness lateral parts and a second thickness central part surrounded by the first thickness lateral parts, etching the first regions of the second insulating layer to reduce the second thickness of the second insulating layer in the first regions, ashing the photoresist, etching first portions of the first thickness of the first insulating layer corresponding to the source and drain electrode regions and the reduced second thickness of the second insulating layer within the first regions to expose source and drain regions of the active layer corresponding to the source and drain electrode regions, and etching a second portion of the second thickness of the second insulating layer to expose a portion of the first insulating layer corresponding to a gate electrode region, forming a gate electrode, a source electrode, and a drain electrode simultaneously on the second insulating layer, forming a passivation layer on the gate electrode, the source electrode, and the drain electrode, and forming a pixel electrode on the passivation layer.

In another aspect, a method of fabricating a polysilicon LCD device includes forming an active layer on a substrate, forming a plurality of insulating layers on the active layer, forming a photoresist pattern on the plurality of insulating layers, the photoresist pattern including first portions exposing first regions of one of the insulating layers each corresponding to one of a source electrode region and a drain electrode region, and a second portion overlying a channel region of the active layer, the second portion having first thickness lateral parts and a second thickness central part surrounded by the first thickness lateral parts, forming a gate electrode region in at least one of the plurality of insulating layers corresponding to the central part of the photoresist pattern, and source and drain electrode regions through each of the plurality of insulating layers, simultaneously forming source, drain, and gate electrodes on each of the plurality of insulating layers, forming a passivation layer on the source, drain, and gate electrodes, and forming a pixel electrode on the passivation layer.

In another aspect, a polysilicon LCD device includes a substrate including a buffer layer, a polysilicon active layer formed on the substrate, a first insulating layer and a second insulating layer formed on the polysilicon active layer, the second insulating layer having a thickness greater than a thickness of the first insulating layer, source and drain electrodes formed on the second insulating layer and connected to the polysilicon active layer, and a gate electrode formed on the first insulating layer, a passivation layer formed on the gate electrode, the source electrode, and the drain electrode, and a pixel electrode material formed on the passivation layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 3A to 3K are cross sectional views of an exemplary fabrication process of a polysilicon LCD device according to the present invention. According to the present invention, the polysilicon LCD device includes a CMOS switching device, which includes a P-type TFT and an N-type TFT, and a display unit TFT comprising one of a P-type TFT and an N-type TFT. Since, according to the present invention, the P-type TFT and the N-type TFT may be fabricated by the same process, except that injected ions may be different, an exemplary P-type TFT fabrication process will be described for the sake of brevity.

Figure 1:
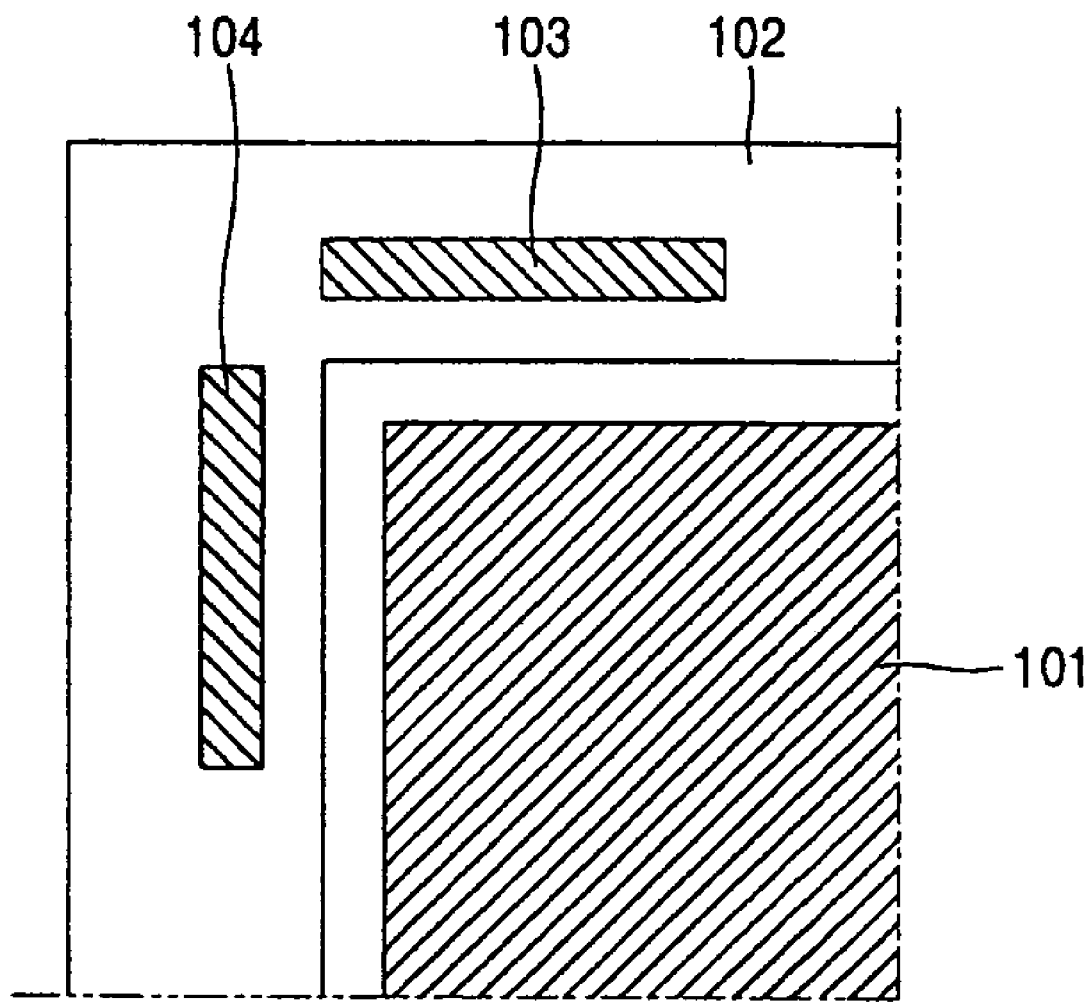
FIG. 1 is a schematic plan view of a polysilicon LCD device according to the related art.
Figure 2A:
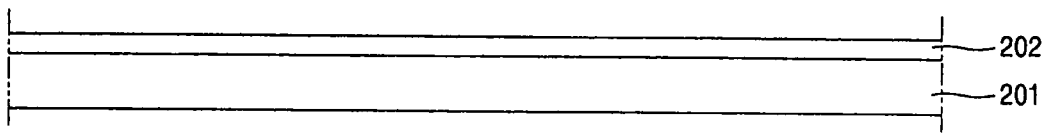
FIGS. 2A to 2I are cross sectional views of a fabrication process for a polysilicon LCD device according to the related art.
Figure 2B:
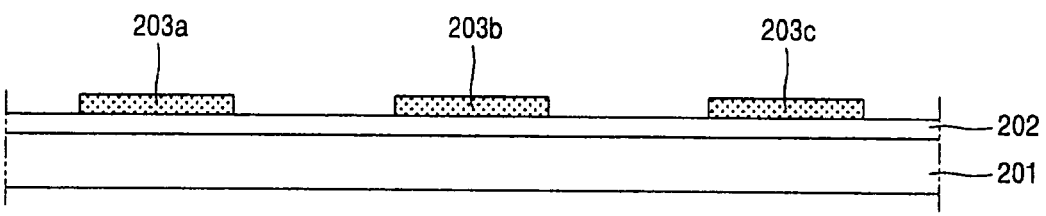
Figure 2C:
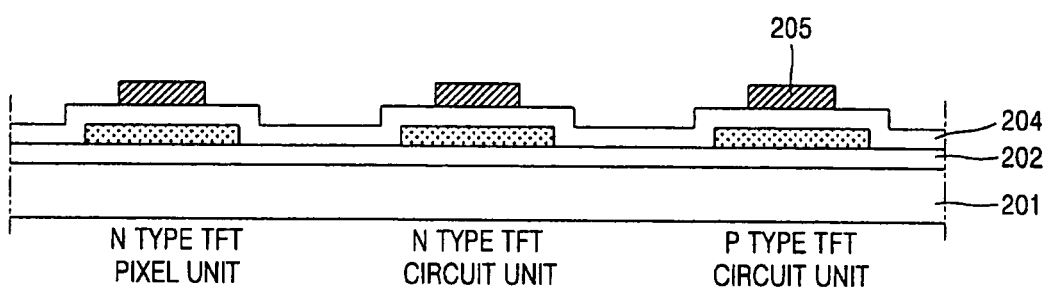
Figure 2D:
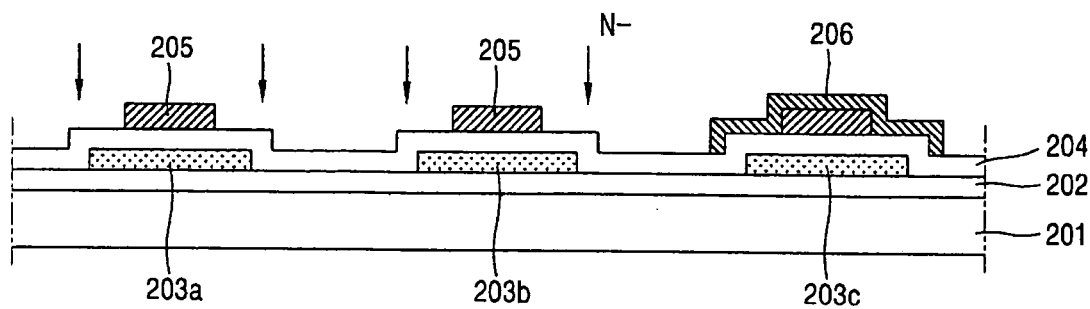
Figure 2E:
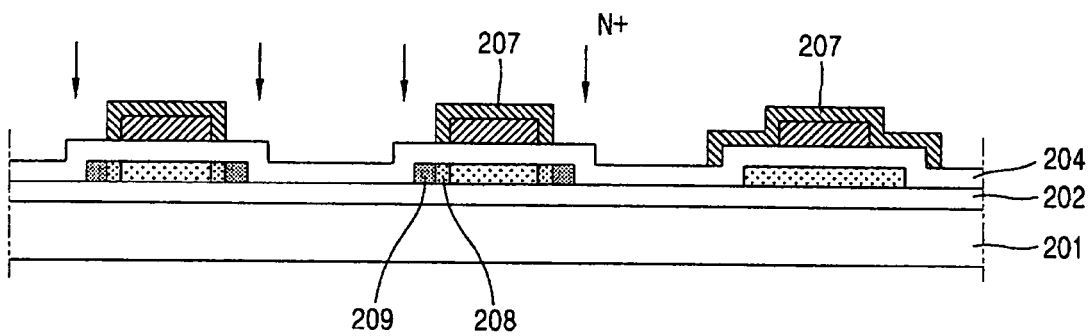
Figure 2F:
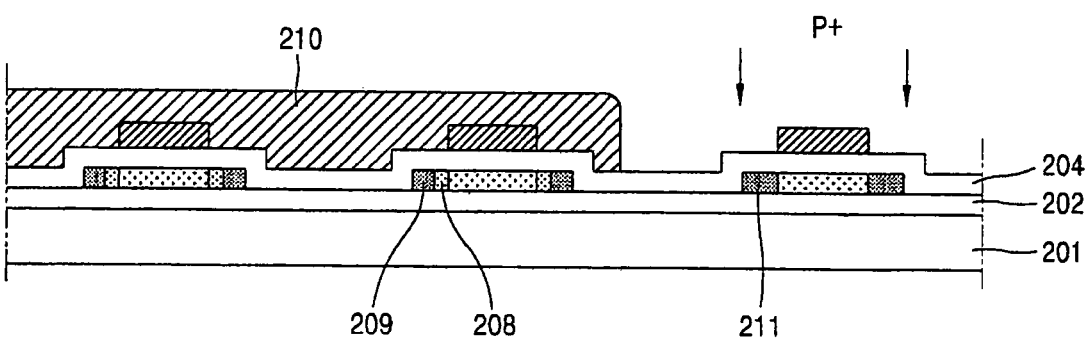
Figure 2G:
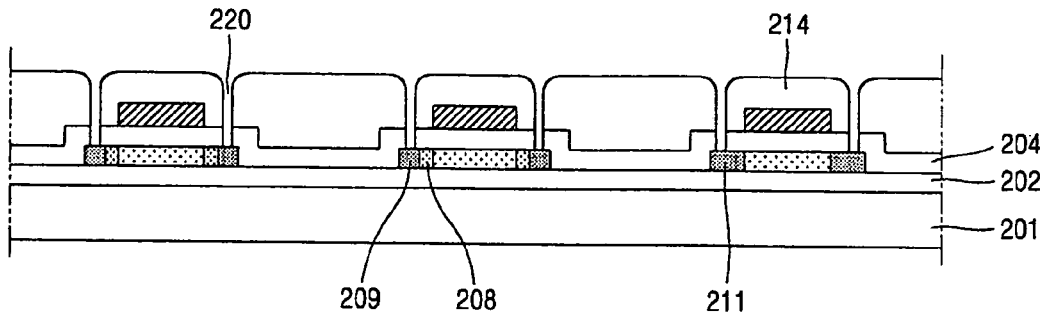
Figure 2H:
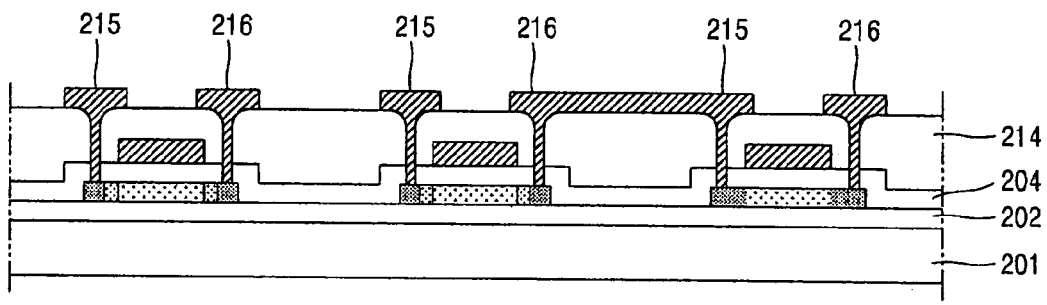
Figure 2I:
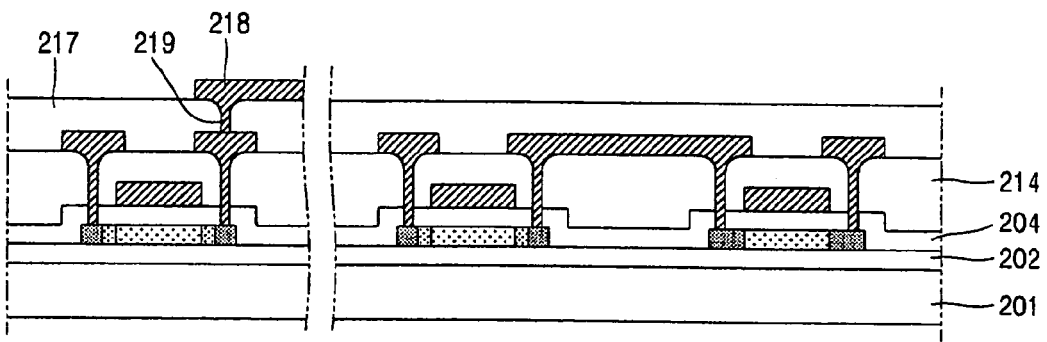
Figure 3A:
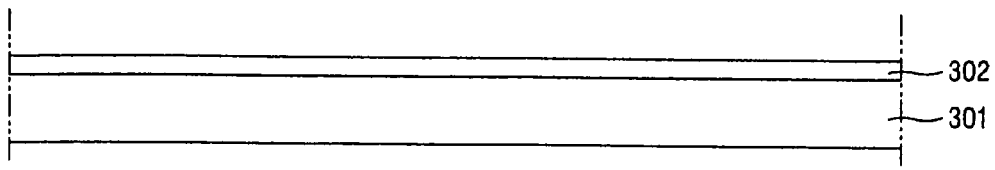
FIGS. 3A to 3K are cross sectional views of an exemplary fabrication process of a polysilicon LCD device according to the present invention.

In FIG. 3A, a buffer layer 302 composed of a silicon oxidation layer, for example, may be formed on a substrate 301. Then, an amorphous silicon layer may be formed on the substrate 301 by a plasma enhanced chemical vapor deposition (PECVD) method, for example. Next, the amorphous silicon layer may be crystallized to provide a crystalline silicon layer having electron mobility characteristics better than electron mobility characteristics of the amorphous silicon layer. The amorphous silicon may be crystallized by heat treatment in a furnace of a high temperature, or by irradiating an excimer laser of high energy upon the amorphous silicon, i.e., an excimer laser annealing (ELA) method. According to the present invention, the ELA method may be used to crystallize the amorphous silicon at a low temperature since a glass substrate may become deformed during high temperatures. In addition, polysilicon formed by the ELA method has better electron mobility characteristics than polysilicon formed by a generalized thermal heat treatment.

For example, electron mobility of amorphous silicon is about 0.1~0.2 $cm^2$/Vsec and electron mobility of polysilicon fabricated by a general thermal process is about 10~20 $cm^2$/Vsec, whereas electron mobility of polysilicon fabricated using the ELA method exceeds about 100 $cm^2$/Vsec. The crystalline silicon formed by the ELA method includes a polycrystalline state that is not considered a perfect single crystalline state. Even if polycrystalline silicon having a plurality of grain boundaries has better electron mobility characteristics than that of amorphous silicon, leakage current may be generated through the grain boundaries. Thus, polysilicon formed by a sequential lateral solidification (SLS) method for minimizing grain boundaries may be used as an active layer of TFT according to the present invention.

The SLS method includes completely melting amorphous silicon such that crystallization occurs along a lateral direction during annealing, thereby obtaining crystalline silicon having a grain size of approximately 1~2 μm. The lateral crystallized polysilicon has electric conductivity characteristics that are better than that of amorphous silicon and commonly formed polysilicon. Accordingly, the lateral crystallized polysilicon is suitable for high speed devices. Thus, the lateral crystallized polysilicon may be used as an active layer in TFT according to the present invention.

Figure 3B:
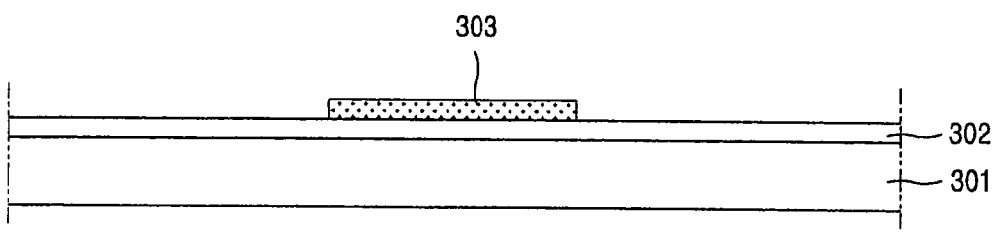

In FIG. 3B, a polysilicon active layer 303 may be patterned on the substrate.

Figure 3C:
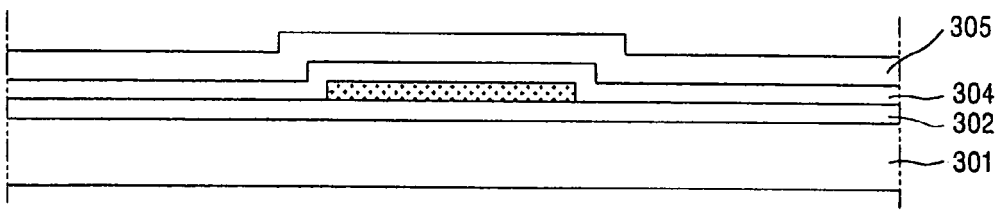

In FIG. 3C, a first insulating layer 304 and a second insulating layer 305 including a silicon oxidation or a silicon nitride may be sequentially formed on the polysilicon active layer 303. A thickness of the second insulating layer 305 may have a first thickness greater than a second thickness of the first insulating layer 304, wherein a portion of the second insulating layer 305 may be precisely etched using a diffraction exposure process at the time of a selective etching of the first insulating layer 304.

Figure 3D:
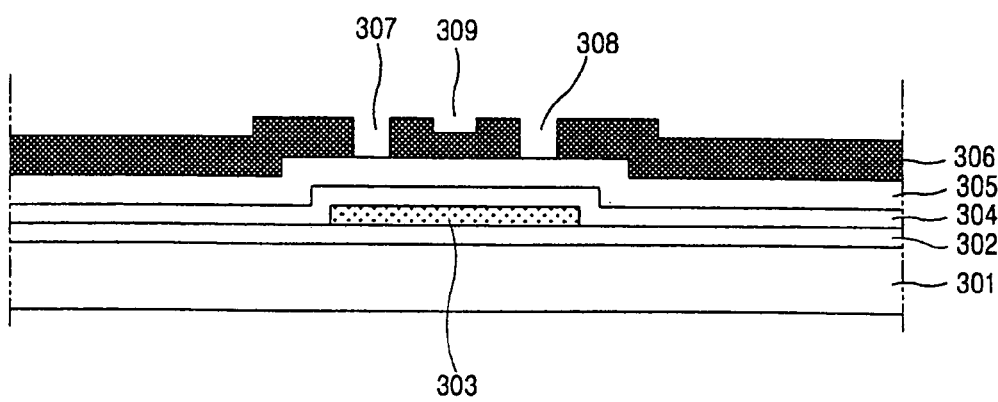

In FIG. 3D, a photoresist 306 may be selectively deposited onto the second insulating layer 305, wherein source/drain electrode regions 307 and 308 and a gate electrode region 309 may be defined by using a diffraction mask. As the result, the source/drain electrode regions 307 and 308 may be completely exposed to light and the gate electrode region 309 may be partially exposed to the light using a diffraction-pattern. Then, the photoresist 306 may be developed. Accordingly, portions of the second insulating layer 305 corresponding to the source electrode region 307 and the drain electrode region 308 may be exposed, and a portion of the photoresist 306 overlying the gate electrode region 309 may be partially removed. Thus, a stepped photoresist pattern may be formed. For example, the stepped photoresist pattern overlying the gate electrode region 309 may include a first portion having a first thickness within a middle part of the stepped photoresist pattern and second portions surrounding the first portion each having a second thickness greater than the first thickness.

Figure 3E:
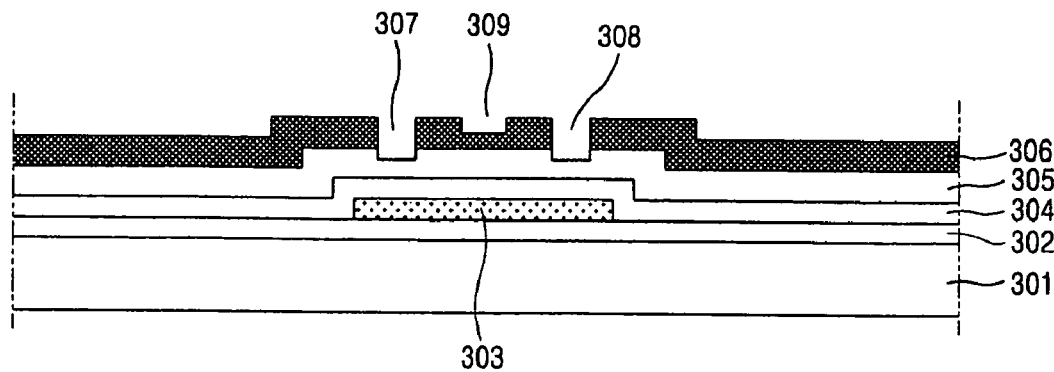

In FIG. 3E, first portions of the second insulating layer 305 corresponding to the source/drain electrode regions 307 and 308 may be partially removed by a dry-etching process. Accordingly, the first portions of the second insulating layer 305 may be etched by an amount equal to about a thickness of the second insulating layer 305. For example, if a thickness of the first insulating layer 304 is about 1000 Å, the second insulating layer 305 of the source/drain electrode regions 307 and 308 may be partially dry-etched by as much as about 1000 Å.

Although not shown, a high concentration of impurity ions may be injected into the source/drain electrode regions 307 and 308, thereby forming source/drain regions. For example, a fifth group element ion, such as Phosphorus, may be injected in order to form an N-type TFT, and a third group element ion, such as Boron, may be injected in order to form an P-type TFT.

Figure 3F:
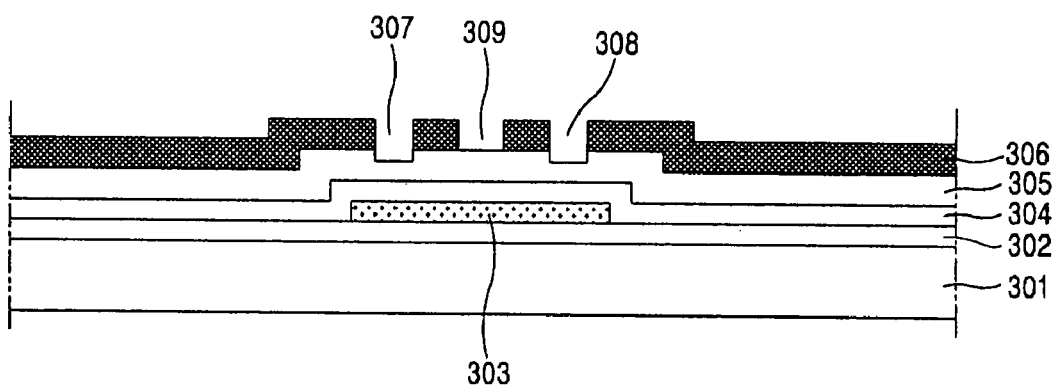

In FIG. 3F, portions of the photoresist 306 may be removed by ashing, thereby exposing a portion of the second insulating layer 305 overlying the gate electrode region 309. The ashing process may include oxidizing by injecting gas, such as oxygen, to precisely remove a portion of the diffraction-exposed portion of the photoresist 306. As a result, portions of the second insulating layer 305 corresponding to the source/drain electrode regions 307 and 308 and the gate electrode region 309 may be exposed.

Figure 3G:
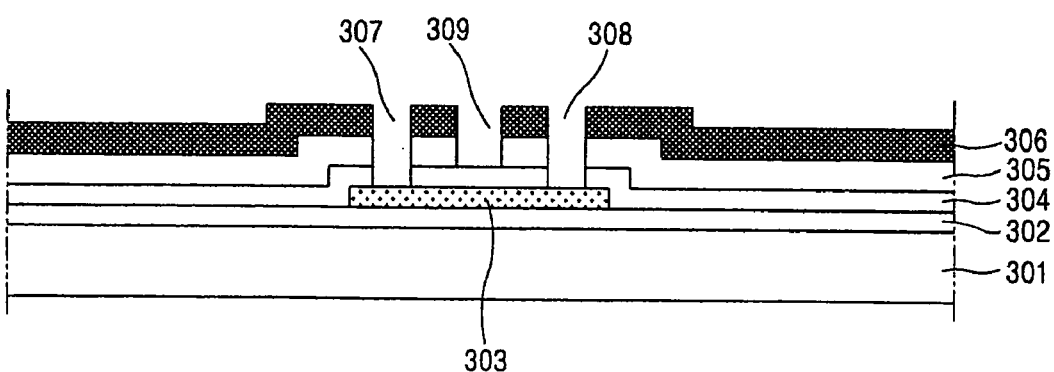

In FIG. 3G, the second insulating layer 305 of the exposed portions of the source/drain electrode regions 307 and 308 and the gate electrode region 309 may be etched. Since the combined thicknesses of the first insulating layer 304 of the source/drain electrode regions 307 and 308 and the thickness of the second insulating layer 305 is equal to the thickness of the second insulating layer 305 of the gate electrode region 309, the first and second insulating layers of the source/drain electrode regions 307 and 308 may be etched within the same time as the etching time of the second insulating layer 305 of the gate electrode region 309. Thus, the first insulating layer 304 and the second insulating layer 305 may be formed of materials having the same etching rate characteristics.

The second insulating layer 305 and the first insulating layer 304 may be removed by a dry-etching process. Since, the active layer 303 may become damaged by the dry-etching process, the dry-etching process may be stopped before the active layer 303 is exposed. In the meantime, while the first insulating layer 304 and the second insulating layer 305 are dry-etched, the dry-etching process may be converted into a wet-etching process. Accordingly, lateral portions of the active layer 303 may be exposed at the source/drain electrode regions 307 and 308, and a portion of the first insulating layer 304 overlying the gate electrode region 309 may be exposed.

Figure 3H:
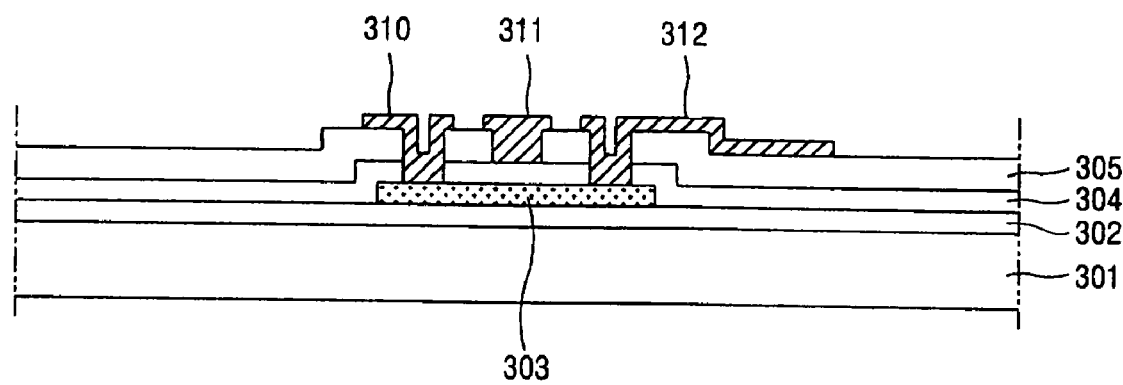

In FIG. 3H, a conductive layer may be formed along an entire surface of the substrate 301 by a sputtering method, for example, and photolithography processes may be performed. Accordingly, a source electrode 310, a drain electrode 312, and a gate electrode 311 may be formed. For example, the source electrode 310, the drain electrode 312, and the gate electrode 311 may be simultaneously formed of the same layer.

However, since a data line may also be formed during formation of the source electrode 310, and a gate line may also be formed during formation of the gate electrode to cross the data line, electrical shorting between the data line and the gate line may occur.

Figure 3I:
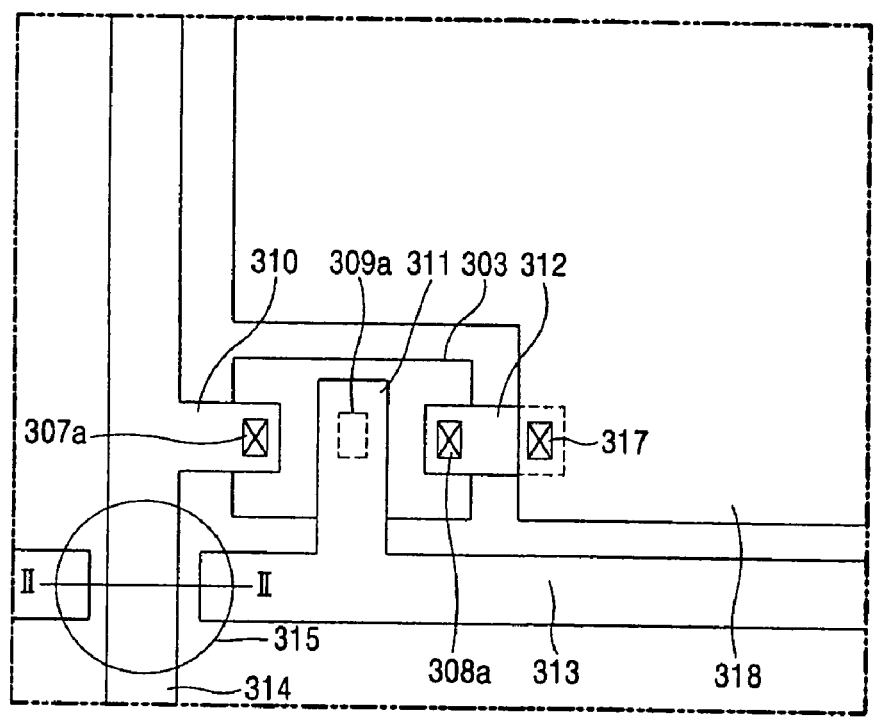

In FIG. 3I, during formation of the source electrode, the drain electrode, and the gate electrode, a gate line 313 may be separated at an intersection region 315 between the gate line 313 and the data line 314, wherein the data line 314 may pass through the separated portion of the gate line 313. Conversely, the data line 314 may be separated and the gate line 313 may pass through the separated portion of the data line 314.

In FIG. 3I, the gate line 313 may be formed to cross the data line 314 including the source electrode 310, wherein the source electrode 310 may diverge from the data line 314 and be connected to the active layer 303 by a first contact hole 307a. The drain electrode 312 may be connected to the active layer 303 by a second contact hole 308a, and the gate electrode 311 may diverge from one side of the gate line 313 and may contact the second insulating layer 305 by a third contact hole 309a.

Figure 3J:
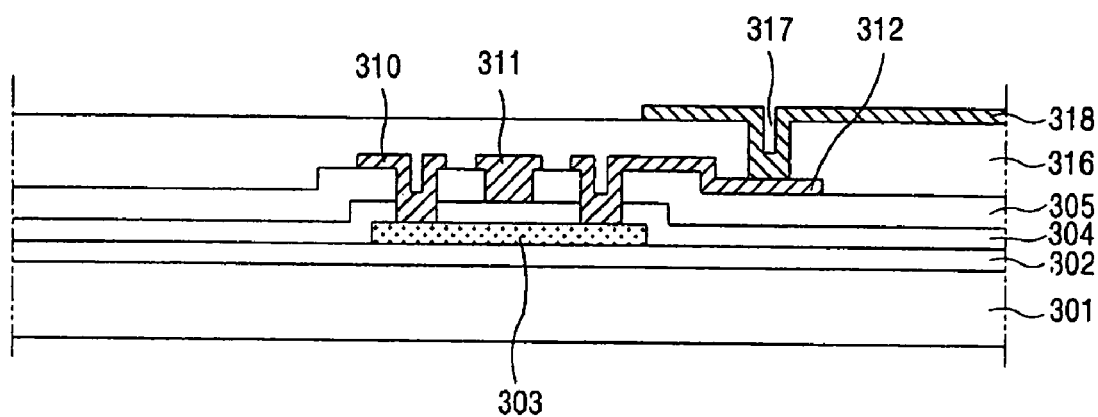

In FIG. 3J, a passivation layer 316 may be formed of one of a silicon oxidation layer and a silicon nitride layer on the second insulating layer 305 and the source, drain, and gate electrodes 310, 312, and 311. In addition, a contact hole 317 may be formed in the passivation layer 316 for connecting a pixel electrode 318 formed on the passivation layer 316 to the drain electrode 312. Furthermore, a contact hole (not shown) may be formed to overlie the separated portions of the gate line 313 during the formation of the contact holes 307a and 308a (in FIG. 3I). Moreover, the separated portions of gate line 313 (in FIG. 3I) may be electrically interconnected to each other by a pixel electrode material during the process for forming the pixel electrode 317.

Figure 3K:
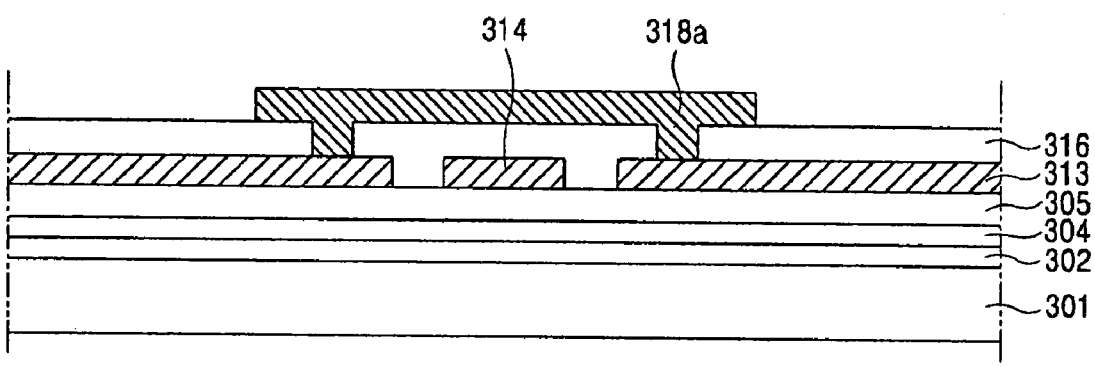

FIG. 3K, which is a cross sectional view along II-II of FIG. 3I, shows the separated portions of the gate line 313 with the data line 314 being formed therebetween, and bridging portion formed of a pixel electrode material 318a may provide for the electrical interconnection of the separated portions of the gate line 313. Although not shown, an alignment layer for an initial alignment of a liquid crystal material may be further formed on the pixel electrode 318.

According to the present invention, a first insulating layer and a second insulating layer may be consecutively formed on an active layer, wherein a source electrode and a drain electrode may be formed on the active layer and a gate electrode may be formed on the first insulating layer. In addition, according to the present invention, an LCD device may be fabricated using a four-mask process. Furthermore, development, etching, and washing process required during photo-mask processes may be reduced, thereby increasing processing efficiency and implement an environmentally friendly LCD fabrication process.

It will be apparent to those skilled in the art that various modifications and variations can be made in the liquid crystal display device and method of fabricating a liquid crystal display device of the present invention without departing from the spirit or scope of the invention. Thus, it is intended that the present invention cover the modifications and variations of this invention provided they come within the scope of the appended claims and their equivalents.

What is claimed is:

1. A polysilicon LCD device, comprising:
   a substrate including a buffer layer;
   a polysilicon active layer formed on the substrate;
   a first insulating layer and a second insulating layer formed on the polysilicon active layer, the second insulating layer having a thickness greater than a thickness of the first insulating layer;
   source and drain electrodes formed on the second insulating layer and connected to the polysilicon active layer, and a gate electrode formed on the first insulating layer;
   a gate line diverging from the gate electrode including separated first and second portions;
   a data line diverging from the source electrode disposed between the separated first and second portions of the gate line;
   a passivation layer formed on the gate electrode, the source electrode, and the drain electrode; and
   a pixel electrode material formed on the passivation layer, wherein the pixel electrode material electrically interconnects the separated first and second portions of the gate line to each other.

2. The device according to claim 1, wherein the source, drain, and gate electrodes are formed on the same layer.

3. The device according to claim 2, wherein the gate electrode is connected to the first insulating layer through a contact hole.

* * * * *